(12) United States Patent
Fukagawa et al.

(10) Patent No.: US 11,414,325 B2
(45) Date of Patent: Aug. 16, 2022

(54) FILM-FORMING MATERIAL AND FILM

(71) Applicant: NIPPON YTTRIUM CO., LTD., Omuta (JP)

(72) Inventors: Naoki Fukagawa, Omuta (JP); Ryuichi Sato, Omuta (JP)

(73) Assignee: NIPPON YTTRIUM CO., LTD.

(*) Notice: Subject to any disclaimer, the term of this patent is extended or adjusted under 35 U.S.C. 154(b) by 610 days.

(21) Appl. No.: 16/343,945

(22) PCT Filed: Aug. 7, 2017

(86) PCT No.: PCT/JP2017/028578
§ 371 (c)(1),
(2) Date: Apr. 22, 2019

(87) PCT Pub. No.: WO2018/083854
PCT Pub. Date: May 11, 2018

(65) Prior Publication Data
US 2019/0241746 A1    Aug. 8, 2019

(30) Foreign Application Priority Data

Nov. 2, 2016  (JP) .............................. JP2016-215615

(51) Int. Cl.
| C09D 1/00 | (2006.01) |
| C01B 11/24 | (2006.01) |
| C09D 5/00 | (2006.01) |
| C23C 14/08 | (2006.01) |
(Continued)

(52) U.S. Cl.
CPC ............ *C01F 17/259* (2020.01); *C01B 11/24* (2013.01); *C09D 1/00* (2013.01); *C09D 5/00* (2013.01); *C09D 7/61* (2018.01); *C23C 14/06* (2013.01); *C23C 14/083* (2013.01); *C23C 14/24* (2013.01); *C01P 2002/72* (2013.01);
(Continued)

(58) Field of Classification Search
None
See application file for complete search history.

(56) References Cited

U.S. PATENT DOCUMENTS

2002/0017635 A1* 2/2002 Wataya .............. C09K 11/7767
252/301.4 R
2002/0160189 A1* 10/2002 Wataya .................... C23C 4/00
428/402
(Continued)

FOREIGN PATENT DOCUMENTS

| CN | 102245540 A | 11/2011 |
| CN | 105505392 A | 4/2016 |
(Continued)

*Primary Examiner* — Ronak C Patel
(74) *Attorney, Agent, or Firm* — Harness, Dickey & Pierce, P.L.C.

(57) ABSTRACT

A coating material containing an oxyfluoride of yttrium and having a Fisher diameter of 1.0 to 10 μm and a tap density TD to apparent density AD ratio, TD/AD, of 1.6 to 3.5. The coating material preferably has a pore volume of pores with a diameter of 100 μm or smaller of 1.0 cm$^3$/g or less as measured by mercury intrusion porosimetry. A coating containing an oxyfluoride of yttrium and having a Vickers hardness of 200 HV0.01 or higher. The coating preferably has a fracture toughness of $1.0 \times 10^2$ Pa·m$^{1/2}$ or higher.

19 Claims, 5 Drawing Sheets

(51) Int. Cl.
*C01F 17/259* (2020.01)
*C23C 14/24* (2006.01)
*C23C 14/06* (2006.01)
*C09D 7/61* (2018.01)

(52) U.S. Cl.
CPC ...... *C01P 2004/02* (2013.01); *C01P 2004/03* (2013.01); *C01P 2004/61* (2013.01); *C01P 2006/10* (2013.01); *C01P 2006/11* (2013.01); *C01P 2006/14* (2013.01); *C01P 2006/16* (2013.01)

(56) References Cited

U.S. PATENT DOCUMENTS

| | | |
|---|---|---|
| 2004/0126614 A1 | 7/2004 | Maeda et al. |
| 2010/0129670 A1 | 5/2010 | Sun et al. |
| 2016/0326058 A1 | 11/2016 | Nagayama et al. |
| 2016/0326059 A1 | 11/2016 | Nagayama et al. |
| 2016/0326623 A1 | 11/2016 | Nagayama et al. |
| 2017/0342539 A1 | 11/2017 | Sato et al. |
| 2018/0016193 A1 | 1/2018 | Fukagawa et al. |

FOREIGN PATENT DOCUMENTS

| | | |
|---|---|---|
| JP | 2004-197181 A | 7/2004 |
| JP | 2007-251091 A | 9/2007 |
| JP | 2016-211070 A | 12/2016 |
| JP | 2016-211071 A | 12/2016 |
| JP | 2016-211072 A | 12/2016 |
| WO | WO-2016-129457 A1 | 8/2016 |
| WO | 2016-140159 A1 | 9/2016 |

\* cited by examiner

Example1 Coating Material

Example1 Coating

Comparative Example1 Coating

FILM-FORMING MATERIAL AND FILM

CROSS-REFERENCE TO RELATED APPLICATIONS

This application is a U.S. National Stage Application of International Application No. PCT/JP2017/028578, filed on Aug. 7, 2017, and claims priority to Japanese Patent Application No. 2016-215615, filed on Nov. 2, 2016. The entire disclosures of the above applications are expressly incorporated herein by reference.

BACKGROUND

Technical Field

This invention relates to a coating material containing an yttrium oxyfluoride and a coating.

Related Art

A halogen gas, such as fluorine or chlorine, is sometimes used in an etching step, such as plasma etching, in the fabrication of semiconductor devices. In order to prevent halogen gas corrosion of an etching apparatus, the inner side of the etching apparatus is usually coated with a highly anti-corrosive substance. Materials containing a rare earth element typified by yttrium are often used as such a substance.

WO2016129457 discloses a coating powder containing a rare earth oxyfluoride (Ln-O—F) and having an average particle size ($D_{50}$) of 0.1 to 10 μm, a pore volume of pores having a diameter of 10 μm or smaller of 0.1 to 0.5 mL/g as measured by mercury intrusion porosimetry, and a ratio of the maximum peak intensity (S0) assigned to a rare earth oxide ($Ln_xO_y$) in the 2θ angle range of from 20° to 40° to the maximum peak intensity (S1) assigned to the rare earth oxyfluoride (Ln-O—F) in the same 2θ angle range, S0/S1, of 1.0 or smaller in powder X-ray diffractometry using Cu-Kα rays or Cu-Kα1 rays. WO2016129457 teaches coating formation using the powder as a coating material by PVD (physical vapor deposition).

WO2016129457 also discloses a sintered compact as a coating material which contains a rare earth oxyfluoride (Ln-O—F), teaching coating formation using the sintered compact by PVD.

According to WO2016129457, use of the disclosed coating powder and sintered compact promises high plasma resistance. However, the demand for semiconductor fabrication apparatus with improved resistance to corrosion by plasma has recently been increasing. The same demand applies to those materials containing yttrium oxyfluoride. In this regard, a coating formed by PVD using the powder or sintered compact described in WO2016129457 still leaves room for further improvement in plasma resistance than before.

SUMMARY

An object of the invention is to provide a coating material capable of eliminating various disadvantages associated with the above mentioned conventional techniques.

As a result of extensive investigations, the inventors have found that a coating material containing an oxyfluoride of yttrium and having a specific Fisher diameter and a specific ratio of tap density TD to apparent density AD, TD/AD, provides by PVD a coating containing the yttrium oxyfluoride and having a specific hardness and that the resultant coating is excellent in resistance to corrosion by plasma, such as fluorine-based or chlorine-based plasma, and thus completed the present invention.

Based on the above findings, the invention provides a coating material containing an oxyfluoride of yttrium (hereinafter also called an yttrium oxyfluoride) and having a Fisher diameter of 1.0 to 10 μm and a tap density TD to apparent density AD ratio, TD/AD, of 1.6 to 3.5.

The invention also provides a coating containing an yttrium oxyfluoride and having a Vickers hardness of 200 HV0.01 or higher.

DETAILED DESCRIPTION OF THE PREFERRED EMBODIMENTS

Figure 1:
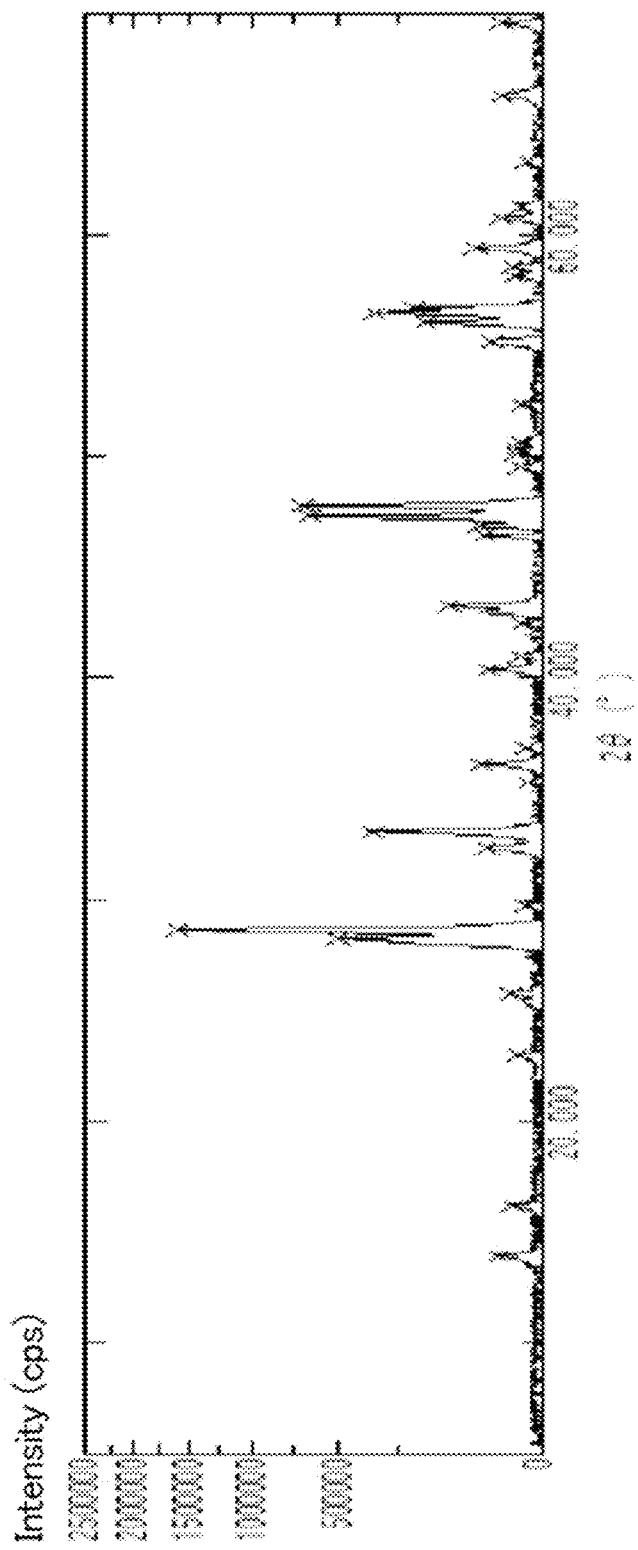
FIG. 1 is a powder X-ray diffractogram of the coating material obtained in Example 1.

The coating material of the invention will be described on the basis of its preferred embodiment.

The coating material of the embodiment is characterized, in one aspect, by containing an yttrium oxyfluoride. An yttrium oxyfluoride is generally represented by $YO_xF_y$ (0<X, and 0<Y). The coating material of the embodiment preferably has a powder form.

$YO_xF_y$ is a compound composed of yttrium (Y), oxygen (O), and fluorine (F). With a view to enhancing the effect in forming a hard and highly plasma-resistant coating film, x preferably satisfies 0.04≤x≤1.00, more preferably 0.10≤x≤1.00, even more preferably 0.30≤x≤1.00, still more preferably 0.50≤x≤1.00. Typical examples of the $YO_xF_y$ include $Y_1O_1F_1$, $Y_5O_4F_7$, $Y_5O_6F_7$, $Y_7O_6F_9$, $Y_{17}O_{14}F_{23}$, and $(YO_{0.826}F_{0.17})F_{1.174}$. These compounds may be used either individually or in combination of two or more thereof. In the following description, $YO_xF_y$ will also be expressed simply as YOF.

PVD is a process in which a coating material is evaporated or sublimated in vacuo, and the vapor of the material reaches and deposits on a substrate to form a coating. In order to form a hard coating, the coating material is required to be efficient in melting and evaporation or in sublimation in the form of powder in a deposition chamber. From this viewpoint, the coating material of the embodiment has a larger particle size than conventional coating powders containing an yttrium oxyfluoride. Specifically, the coating material of the invention has a Fisher diameter of at least 1.0 μm whereby the powder particles are prevented from being swept up to cause formation of projections on the surface of the resulting coating. Having a Fisher diameter of not greater than 10 μm, on the other hand, the coating material of the invention melts and evaporates or sublimates at a certain or higher rate thereby enabling stable coating formation. For these considerations, the Fisher diameter of the coating material is preferably 1.3 to 8 μm, more preferably 1.5 to 6

μm. The Fisher diameter can be measured by the method described in Examples hereinafter given.

The coating material of the embodiment is also characterized, in another aspect, by having a ratio of tap density TD to apparent density AD, TD/AD in a specific range. The inventors intensively studied the relation between the physical properties of a powder containing an yttrium oxyfluoride and the hardness of a coating formed therefrom by PVD. They found as a result that the TD/AD is an important factor for obtaining a hard coating. A sufficiently hard coating results when the TD/AD of the yttrium oxyfluoride-containing coating material falls in a specific range. Having a TD/AD in a specific range is also effective in preventing the powder particles from being swept up in a deposition chamber. Specifically, the TD/AD is preferably 1.6 to 3.5, more preferably 1.7 to 3.2, even more preferably 1.8 to 3.0. The TD/AD can be determined by the method described in Examples given later.

With the view of obtaining a harder and more plasma-resistant coating, the tap density TD of the coating material of the embodiment is preferably 1.0 to 2.0 $g/cm^3$, more preferably 1.2 to 1.8 $g/cm^3$.

It is preferred that the coating material of the embodiment have a specific volume of pores of 100 μm or smaller diameter as measured by mercury porosimetry (hereinafter also simply referred to as the pore volume). The pore volume depends on not only the particle size of the coating material but also the shape and the like of the particles constituting the coating material. Therefore, powders having the same particle size do not always have the same pore volume. Specifically, the pore volume of the coating material of the invention is preferably 1.0 $cm^3/g$ or smaller. A coating material having the pore volume in that range provides a PVD coating which is harder and more plasma resistant. To ensure the hardness of the resulting coating, the pore volume of the coating material of the invention is more preferably 0.9 $cm^3/g$ or smaller, even more preferably 0.8 $cm^3/g$ or smaller. While the lower limit of the pore volume is not particularly specified, it is usually 0.1 $cm^3/g$ or larger. The pore volume can be determined by the method described in Examples.

It is preferred that the coating material of the embodiment have an angle of repose in a specific range. A material with a larger angle of repose is less fluid and therefore capable of forming a coating by PVD in a more stable manner. As a result, a coating with desirable hardness and fracture toughness and fewer projections is obtained easily. The angle of repose of the coating material of the embodiment is preferably 40° or larger, more preferably 43° or larger, even more preferably 45° or larger. There is no preferred upper limit on the angle of repose, but the angle of repose is generally 60° or smaller. The angle of repose can be measured by the method described in Examples.

The coating material having the specific Fisher diameter, tap density to apparent density ratio (TD/AD), pore volume, and angle of repose is preferably prepared by the method hereinafter described.

With a view to form a coating with further improved resistance to corrosion by plasma, the oxygen content of the coating material is preferably 0.3 to 13 mass %, more preferably 3 to 13 mass %, even more preferably 6 to 13 mass %. The oxygen content can be determined by the method described in Examples.

The coating material of the embodiment shows a peak assigned to YOF when analyzed by X-ray diffractometry (XRD). In the analysis by XRD, it is preferred that the X-ray diffractogram of the coating material of the embodiment be such that the main peak appearing in the 2θ angle range of from 0° to 70° be assigned to YOF. In the XRD analysis, a diffraction peak assigned to $YF_3$ may or may not be observed, but if observed, the main peak assigned to $YF_3$ appearing in the 2θ angle range of from 0° to 70° is preferably lower than the main peak of YOF in the same 2θ angle range. More specifically, the height of the main peak assigned to $YF_3$ is preferably not more than 20% of that of the main peak assigned to YOF. In the XRD analysis, a diffraction peak assigned to $Y_2O_3$ may or may not be observed in the 2θ angle range of from 0° to 70°, but if observed, the height of the main peak assigned to $Y_2O_3$ in that range is preferably 40% or less, more preferably 30% or less, of that of the main peak assigned to YOF in that range. XRD of the coating material can be performed according to the method described in Examples.

Coating techniques applicable to the coating material of the embodiment include PVD. PVD is a process in which a metal evaporant is heated into vapor. PVD may be ion plating. Ion plating is a process in which evaporant vapor is positively charged in plasma in a reduced pressure vessel, attracted to a negatively charged substrate, and deposited on the substrate to form a coating layer. PVD may be vacuum deposition, which is a process using no plasma. In performing PVD, an inert gas, such as argon, is introduced into a deposition chamber. In the present embodiment ion plating is particularly preferred in terms of obtaining a dense, hard, and highly plasma-resistant coating. In view of obtaining a coating with further improved plasma-resistance, ion plating is preferably carried out under conditions of: inert gas or reactive gas pressure, 0.01 to 0.1 Pa; EB output power, 0.4 to 10 kW; and RF power, 0.2 to 3.0 Kw.

A preferred method for preparing the coating material of the embodiment will then be described. It should be understood, however, that the coating material of the invention is by no means limited by the method of preparation.

The preferred method for preparing the coating material of the embodiment includes step 1 in which yttrium oxide ($Y_2O_3$) powder and yttrium fluoride ($YF_3$) powder are dry blended and step 2 in which the mixture obtained in step 1 is fired. Steps 1 and 2 will be described in detail.

Step 1:

The $Y_2O_3$ powder to be blended preferably has a BET specific surface area (S) of 1 to 30 $m^2/g$. The $YF_3$ powder to be blended preferably has a BET specific surface area (S) of 0.1 to 5 $m^2/g$. The BET specific surface area (S) can be determined using an automatic surface area analyzer Macsorb® model 1201 from Mountech Co., Ltd. according to the single point BET method. A nitrogen-helium mixed gas ($N_2$: 30 vol %) may be used as an adsorbate.

In step 1, $Y_2O_3$ powder and $YF_3$ powder are dry blended. Dry blending may be conducted by any means. For example, the powders may be mixed by agitation in a vessel, or a mixing machine, such as a double cone blender, a V blender, or a Henschel mixer, may be used. Incorporating ammonium fluoride ($NH_4F$) into the $Y_2O_3/YF_3$ mixed powder is recommended because of enabling low-temperature firing. The mixing ratio of $Y_2O_3$ powder, $YF_3$ powder, and ammonium fluoride ($NH_4F$) is preferably 2.6 to 61.9 mass % of $Y_2O_3$, 36.0 to 96.2 mass % of $YF_3$, and 1.2 to 2.1 mass % of ammonium fluoride ($NH_4F$), provided that the total of them does not exceed 100 mass %.

Step 2:

The mixture obtained in step 1 is fired in step 2. The firing atmosphere may be an oxygen-containing atmosphere, such as air, or an inert atmosphere, such as argon or nitrogen gas atmosphere. An oxygen-containing atmosphere is preferred in view of sufficiently forming $YO_xF_y$. The firing temperature is preferably 450° C. or higher and lower than 750° C. Firing at a temperature in that range results in more efficient production of the coating material of the invention. The firing temperature is more preferably 500° to 700° C., even more preferably 550° to 650° C.

The firing time is preferably 1 to 100 hours, more preferably 5 to 50 hours, even more preferably 10 to 30 hours, provided that the firing temperature is within the above range.

The thus prepared coating material is suitably used to form the coating of the embodiment. Examples of substrates to be coated include metals such as aluminum, metal alloys such as aluminum alloys, ceramics such as alumina, and quartz. The substrate on which the coating is to be formed may previously coated with an anti-corrosive coating.

The coating of the embodiment will next be described.

The coating of the embodiment is characterized, in one aspect, by containing an yttrium oxyfluoride represented by $YO_xF_y$, wherein $0<x$ and $0<y$, which will also be expressed simply by $YO_xF_y$, or more simply by YOF. $YO_xF_y$ is a compound composed of yttrium (Y), oxygen (O), and fluorine (F). In order for the coating to be hard and highly plasma-resistant, x preferably satisfies $0.04 \leq x \leq 1.00$, more preferably $0.10 \leq x \leq 1.00$, even more preferably $0.30 \leq x \leq 1.00$, still more preferably $0.50 \leq x \leq 1.00$. Typical examples of the $YO_xF_y$ include $Y_1O_1F_1$, $Y_5O_4F_7$, $Y_5O_6F_7$, $Y_7O_6F_9$, $Y_{17}O_{14}F_{23}$, and $(YO_{0.826}F_{0.17})F_{1.174}$. The coating may contain either one or more of these compounds.

The coating of the embodiment contains YOF and has a Vickers hardness of 200 HV0.01 or higher. With this hardness the coating exhibits excellent resistance to corrosion by plasma, such as halogen-based plasma. Such a hard coating containing YOF has been difficult to form from conventional coating materials. To further ensure the plasma corrosion resistance, the coating preferably has a Vickers hardness of 220 HV0.01 or higher, more preferably 250 HV0.01 or higher, even more preferably 280 HV0.01 or higher. The coating with the Vickers hardness in that range is obtained by processing the coating material of the embodiment by PVD. In particular, a hard coating is easily formed by ion plating. The Vickers hardness can be measured by the method described in Examples.

In order for the coating of the embodiment to have excellent plasma resistance, the coating preferably has, in addition to the above specified hardness, a fracture toughness of $1.0 \times 10^2$ Pa·m$^{1/2}$ or more. For that purpose, the fracture toughness is more preferably $1.0 \times 10^3$ Pa·m$^{1/2}$ or more, even more preferably $1.0 \times 10^4$ Pa·m$^{1/2}$ or more, still more preferably $1.0 \times 10^5$ Pa·m$^{112}$ or more, yet more preferably $1.0 \times 10^6$ Pa·m$^{112}$ or more. The fracture toughness can be determined by the method described in Examples. The coating with the above specified preferred fracture toughness can be obtained by processing the coating material of the embodiment by PVD.

With a view to improving step coverage as well as plasma corrosion resistance, the coating of the embodiment preferably has a thickness of at least 3 μm. With the same view, the thickness of the coating is more preferably 5 μm or larger, even more preferably 10 μm or larger. There is no particular upper limit on the coating thickness. The coating with the above specified preferred thickness can be obtained by processing the coating material of the embodiment by PVD. The coating thickness can be measured by the method described in Examples.

It is preferred that the number of projections per 1.0 cm×1.0 cm area of the coating of the embodiment be not greater than 10, more preferably not greater than 8, even more preferably not greater than 4, still more preferably not greater than 2. The expression "the number of projections per 1.0 cm×1.0 cm area" denotes the number of projections observed in a 1.0 cm×1.0 cm square of a surface of a coating. Because conventional coating powders containing an oxyfluoride of yttrium have smaller particle sizes and are therefore more light-weight, they are liable to be swept up during PVD. The swept up powder particles can adhere to the coating film being deposited, and on which particles vapor continues to deposit to form projections. If a coating having such projections is provided in a plasma etching chamber in the semiconductor fabrication, the projections are selectively etched by plasma to cause particle shedding. In contrast, the coating of the embodiment has very few projections and is therefore excellent in resistance to corrosion by plasma. As used herein, the term "projection" refers to a projection on the surface of the coating with a maximum length of 5 μm or larger. The term "maximum length" as used herein refers to the maximum length of the shape of a projection when viewed on its projecting side from the direction perpendicular to the surface of the coating, i.e., the length of the longest of all the line segments crossing the top-view shape of the projection. When the top-view shape of a projection is circular, the maximum length corresponds to the diameter of the circle. The number of projections can be counted by the method described in Examples.

The coating of the embodiment shows an X-ray diffraction peak assigned to YOF when analyzed by XRD. In the analysis by XRD, it is preferred that the main peak appearing in the 2θ angle range of from 0° to 70° be assigned to YOF. In the XRD analysis, a diffraction peak assigned to $YF_3$ may or may not be observed, but if observed, the main peak assigned to $YF_3$ appearing in the 2θ angle range of from 0° to 70° is preferably lower than the main peak of YOF in the same 2θ angle range. More specifically, the height of the main peak assigned to $YF_3$ is preferably not more than 20% of that of the main peak assigned to YOF. A diffraction peak assigned to $Y_2O_3$ may or may not be observed in the 2θ angle range of from 0° to 70°, but if observed, the height of the main peak assigned to $Y_2O_3$ in that range is preferably 40% or less, more preferably 30% or less, of that of the main peak assigned to YOF in that range. XRD of the coating can be performed according to the method described in Examples.

The oxygen content of the coating is preferably 0.3 to 15 mass %, more preferably 3 to 14 mass %, even more preferably 6 to 13 mass %. The oxygen content can be determined by the method described in Examples.

The excellent plasma resistance being taken advantage of, the coating of the embodiment is used to coat the inside components of etching equipment of a semiconductor fabrication apparatus, such as the etching chamber wall, substrate holder, electrostatic chuck, and gas inlet, and constituent members of these components. The coating of the embodiment is applicable to constituent members of various plasma processing systems and chemical plants as well as the inside of a semiconductor fabrication apparatus and its constituent members. The coating of the embodiment exhibits excellent resistance to both fluorine- and chlorine-based plasma as will be demonstrated in Examples below. The coating of the embodiment also shows excellent resistance to plasma of various gases, such as oxygen, $NF_3$, oxygen/ $NF_3$, ammonia, $NF_3$/oxygen, nitrogen, and hydrogen, and does not substantially change in surface properties during plasma etching using these gases.

EXAMPLES

The invention will now be illustrated in greater detail, but it should be understood that the invention is not construed as being limited thereto. Unless otherwise noted, all the percentages are by mass.

Example 1

Sixty-five grams of yttrium oxide ($Y_2O_3$) powder available from Nippon Yttrium Co., Ltd. (BET specific surface area S: 3.1 m$^2$/g), 28 g of yttrium fluoride ($YF_3$) powder from Nippon Yttrium Co., Ltd. (BET specific surface area S: 0.4 m$^2$/g), and 7 g of ammonium fluoride ($NH_4F$) were dry mixed. The resulting mixture was put in an alumina container and fired in an electric oven in the atmosphere at 700° C. for 10 hours to make a coating material of Example 1.

Example 2

Sixty-four grams of yttrium oxide ($Y_2O_3$) powder from Nippon Yttrium Co., Ltd. (BET specific surface area S: 3.1 m$^2$/g), 29 g of yttrium fluoride ($YF_3$) powder from Nippon Yttrium Co., Ltd. (BET specific surface area S: 0.4 m$^2$/g), and 7 g of ammonium fluoride ($NH_4F$) were dry mixed. The resulting mixture was put in an alumina container and fired in an electric oven in the atmosphere at 650° C. for 12 hours to prepare a coating material of Example 2.

Example 3

Thirty-nine grams of yttrium oxide ($Y_2O_3$) powder from Nippon Yttrium Co., Ltd. (BET specific surface area S: 3.1 m$^2$/g), 39 g of yttrium fluoride ($YF_3$) powder from Nippon Yttrium Co., Ltd. (BET specific surface area S: 0.4 m$^2$/g), and 12 g of ammonium fluoride ($NH_4F$) were dry mixed. The resulting mixture was put in an alumina container and fired in an electric oven in the atmosphere at 550° C. for 16 hours to prepare a coating material of Example 3.

A coating material was prepared in Comparative Example 1 below in the same manner as in Example 9 of WO2016129457 cited above.

Comparative Example 1

Forty-seven grams of yttrium oxide ($Y_2O_3$) powder available from Nippon Yttrium Co., Ltd. (BET specific surface area S: 20 m$^2$/g; $D_{50}$: 0.24 μm) and 53 g of yttrium fluoride ($YF_3$) powder from Nippon Yttrium Co., Ltd. (BET specific surface area S: 0.4 m$^2$/g; $D_{50}$: 7.4 μm) were mixed ($YF_3$/$Y_2O_3$ molar ratio=1.74). The resulting mixture was put in an alumina dish and fired in an electric oven in the atmosphere at 950° C. for 8 hours. The fired product was dry ground in an atomizer, mixed with an equal mass of pure water, and wet ground first in a bead mill using 2 mm-diameter yttria-stabilized zirconia (YSZ) balls for 2 hours and then in a bead mill using 1.2 mm-diameter YSZ balls for 0.5 hours to make a wet-ground slurry. The wet-ground slurry was dried at 120° C. for 12 hours to give a coating material of Comparative Example 1.

The coating materials prepared in Examples 1 to 3 and Comparative Example 1 were analyzed based on the following properties 1 to 5.

1. Fisher Diameter (μm)

Fisher diameter (μm) was measured using Fisher Model 95 Sub-Sieve Sizer from Fisher Scientific in accordance with JIS H2116.

2. TD/AD

Tap density TD (g/cc) and apparent density AD (g/cc) were measured using a multi-functional powder properties measuring instrument Multi-Tester MT-1001k (from Seishin Enterprise Co., Ltd.) in accordance with JIS Z2512 and JIS K5101, respectively. The TD to AD ratio was calculated from the measurements.

3. Pore Volume

Pore volume was measured using AutoPore IV from Micromeritics in accordance with JIS R1655.

4. Angle of Repose

Angle of repose was measured using a multi-functional powder properties measuring instrument Multi-Tester MT-1001k (from Seishin Enterprise Co., Ltd.) in accordance with JIS R9301.

5. Oxygen Content

Oxygen content was measured by the inert gas fusion method using an oxygen/nitrogen analyzer EMGA-920 from Horiba, Ltd.

The results of the measurements of the properties 1 to 4 are shown in Table 1.

TABLE 1

| | Fisher Diameter (μm) | TD (g/cm$^3$) | AD (g/cm$^3$) | TD/AD | Pore Volume (cm$^3$/g) | Angle of Repose (°) |
|---|---|---|---|---|---|---|
| Example 1 | 3.0 | 1.48 | 0.58 | 2.55 | 0.51 | 50 |
| Example 2 | 2.7 | 1.43 | 0.62 | 2.31 | 0.60 | 47 |
| Example 3 | 4.8 | 1.55 | 0.63 | 2.46 | 0.55 | 46 |
| Compara. Example 1 | 0.9 | 1.15 | 0.73 | 1.57 | 0.33 | 37 |

The oxygen content of the coating materials of Examples 1, 2, and 3 as measured by the method 5 described above were 12%, 9%, and 6%, respectively. The oxygen content of the coating material of Comparative Example 1 measured by the same method was 10%. The coating materials of Examples were analyzed by powder XRD under the conditions below. As a result, the main peak observed in the 2θ angle range of from 0° to 70° was assigned to YOF in every Example. The height of the main peak assigned to $YF_3$ in the 2θ angle range of from 0° to 70° was 20% or less of that of the main peak assigned to YOF in the same 2θ angle range in every Example. The height of the main peak assigned to $Y_2O_3$ in the 2θ angle range of from 0° to 70° was 40% or less of that of the main peak assigned to YOF in the same 2θ angle range in each Example. The X-ray diffractogram of the coating material of Example 1 is shown in FIG. 1.

Method for Measuring X-Ray Diffraction:
  Equipment: Ultima IV (from Rigaku Corp.)
  Source: CuKα rays
  Tube voltage: 40 kV
  Tube current: 40 mA
  Scanning speed: 2°/min
  Step size: 0.02°
  Measurement range: 2θ=0° to 70°

Figure 2A:
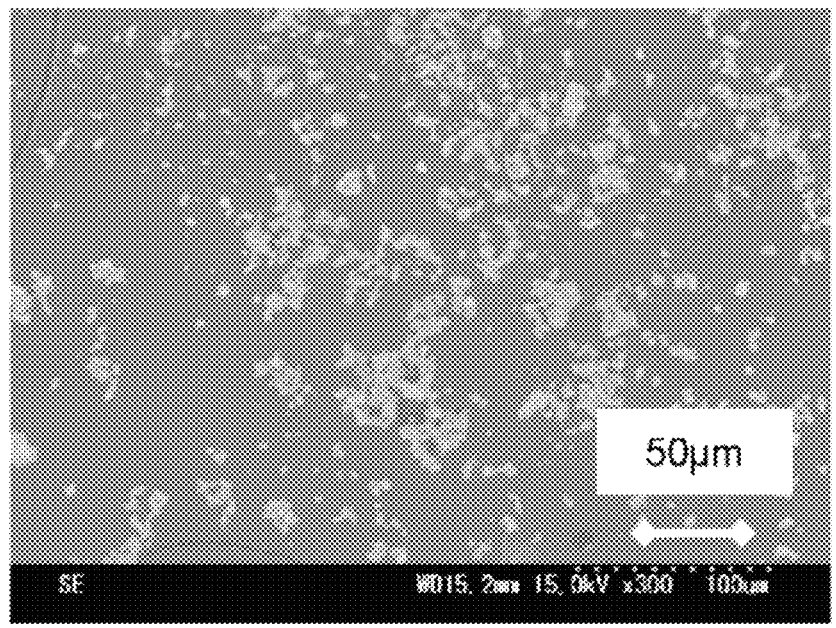
FIG. 2A and FIG. 2B are each a scanning electron micrograph of the coating material obtained in Example 1.
Figure 2B:
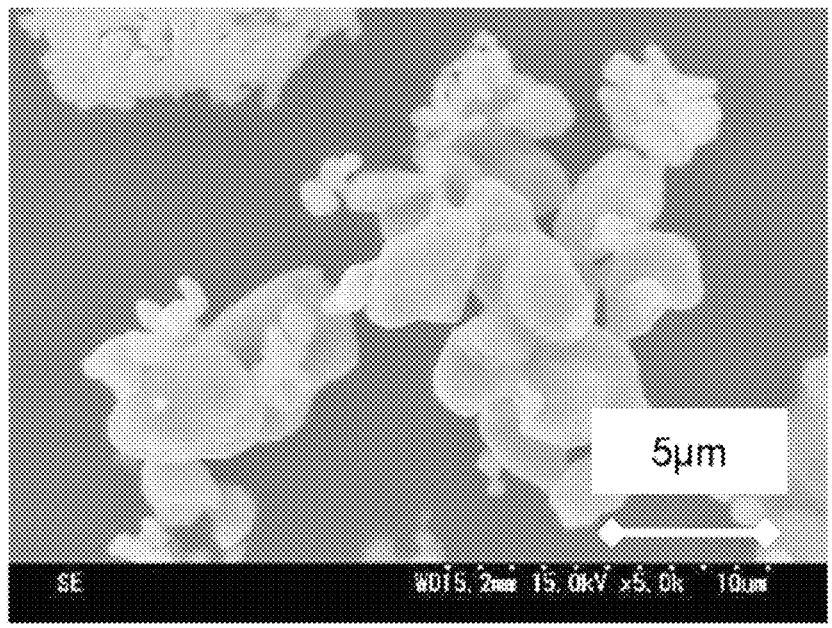

The coating material of Example 1 was observed using an SEM. The SEM images are shown in FIGS. 2A and 2B.

A coating was produced by the following method using each of the coating materials of Examples 1 to 3 and Comparative Example 1. The coatings formed of the coating materials of Examples 1 to 3 and Comparative Example 1 will be called the coating of Examples 1 to 3 and Comparative Example 1, respectively.

Production of Coating:

A 100 mm-side square alumina ceramic plate (thickness: 2 mm) was prepared as a substrate. A coating was formed on the substrate by ion plating under conditions: argon gas pressure, 0.04 Pa; EB output power, 4.0 kW; and RF output power, 2.0 kW.

The coatings of Examples 1 to 3 and Comparative Example 1 were examined for the following properties 6 to 10.

6. Vickers Hardness and Fracture Toughness

Vickers hardness was measured in accordance with JIS Z2244 using a tester HM-220 from Mitsutoyo Corp. A sample on the tester was indented with a diamond pyramid indenter with a 136° angle between opposite faces by applying a test force of 0.01 kgf for 10 seconds in the atmosphere at 25° C. to leave an indentation on the surface of the sample. The hardness is calculated on the basis of the area of the indentation.

Fracture toughness was obtained in accordance with JIS R1607. The length of the cracks propagated from the corners of the indentation formed in the Vickers hardness measurement was measured using a scanning electron micrograph. The fracture toughness value was calculated from the following equation, in which the applied load was $1.96 \times 10^{-4}$ N, and the elasticity modulus was $1.8 \times 10^{11}$ Pa.

$$\text{Fracture toughness} = 0.018 \times (E/HV)^{1/2}(P/C^{3/2})$$

where E, elasticity modulus (Pa); HV, Vickers hardness (Pa); P, applied load (N); C, half of average crack length (m).

The Vickers hardness was calculated according to equation:

$$HV = 1.8544 \times P/(2a)^2$$

where a is half of diagonal length of indentation (m).

Vickers hardness measurement and fracture toughness measurement were taken at three points, and the averages of the measurements were obtained.

7. Coating Thickness

Coating thickness was measured using Surfcom from Tokyo Seimitsu.

8. Number of Projections

Figure 3:
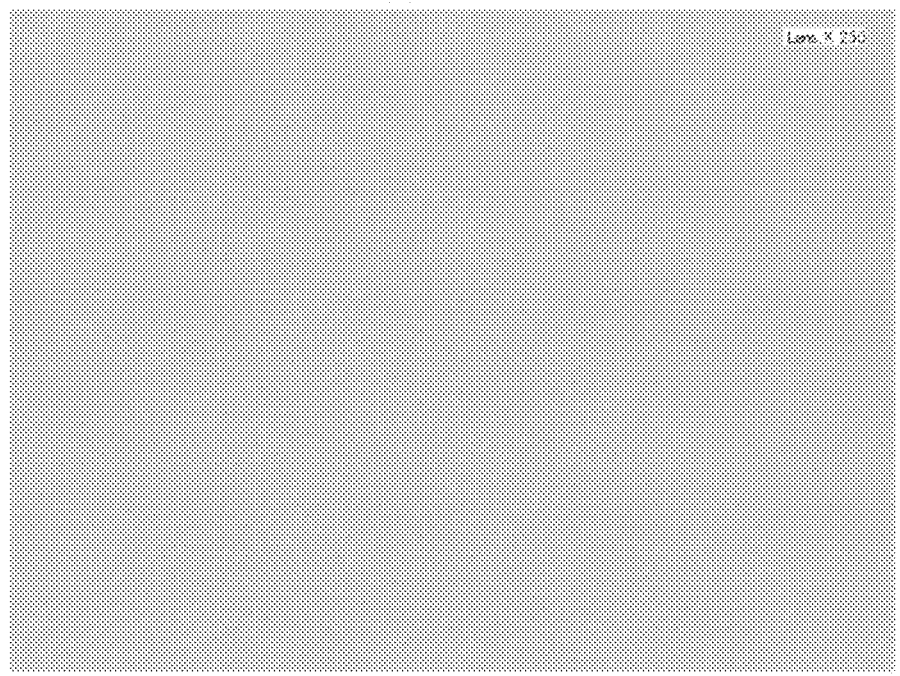
FIG. 3 is an optical micrograph of the coating obtained in Example 1.
Figure 4:
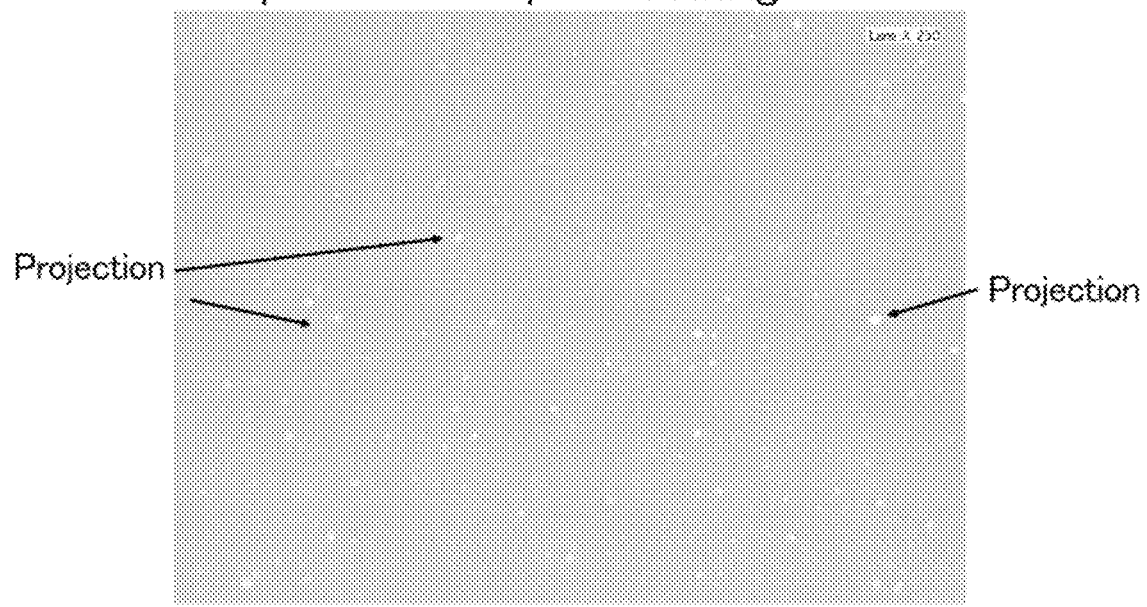
FIG. 4 is an optical micrograph of the coating obtained in Comparative Example 1.
Figure 5:
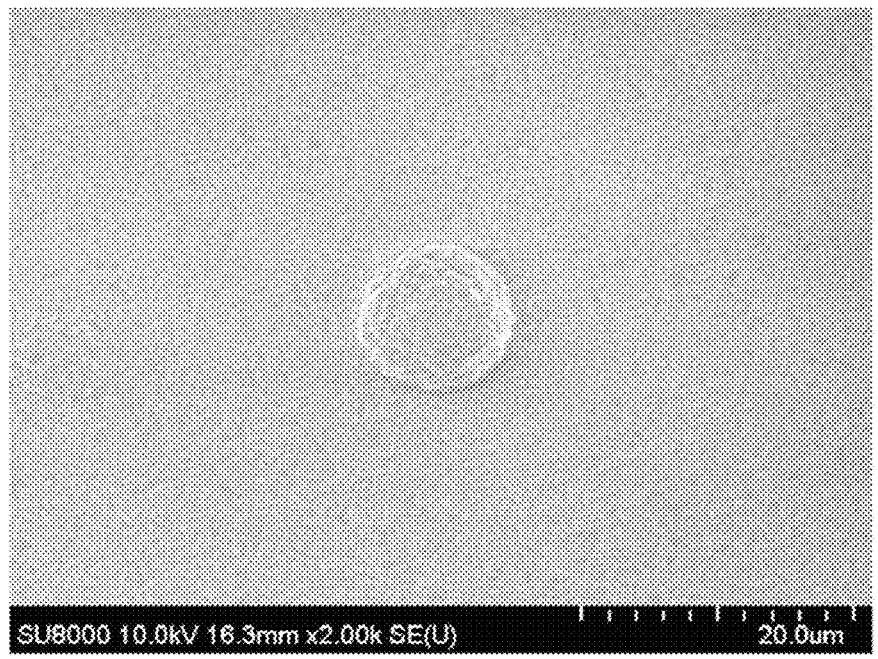
FIG. 5 is a scanning electron micrograph of a projection.

Projections with a maximum length of 5 μm or greater were counted over a 1.0 cm×1.0 cm area of the coating using an optical microscope (×250). Count was taken at three different areas, and the results were averaged. The optical micrograph of the coating of Example 1 is shown in FIG. 3, and that of Comparative Example 1 is shown in FIG. 4. The projections are displayed as white spots in, e.g., FIG. 4. An SEM image of one of the projections is shown in FIG. 5. The projection shown in FIG. 5 has a generally elliptical top-view shape.

The results of the above measurements are shown in Table 2.

TABLE 2

| | Vickers Hardness (HV0.01) | Fracture Toughness (Pa·m$^{1/2}$) | Coating Thickness (μm) | Number of Projections |
|---|---|---|---|---|
| Example 1 | 284.3 | $5.7 \times 10^6$ | 15 | 2 |
| Example 2 | 382.4 | $3.7 \times 10^3$ | 15 | 4 |
| Example 3 | 441.2 | $8.5 \times 10^2$ | 15 | 7 |
| Comparative Example 1 | 196.2 | $0.9 \times 10^2$ | 15 | 198 |

9. XRD

Figure 6:
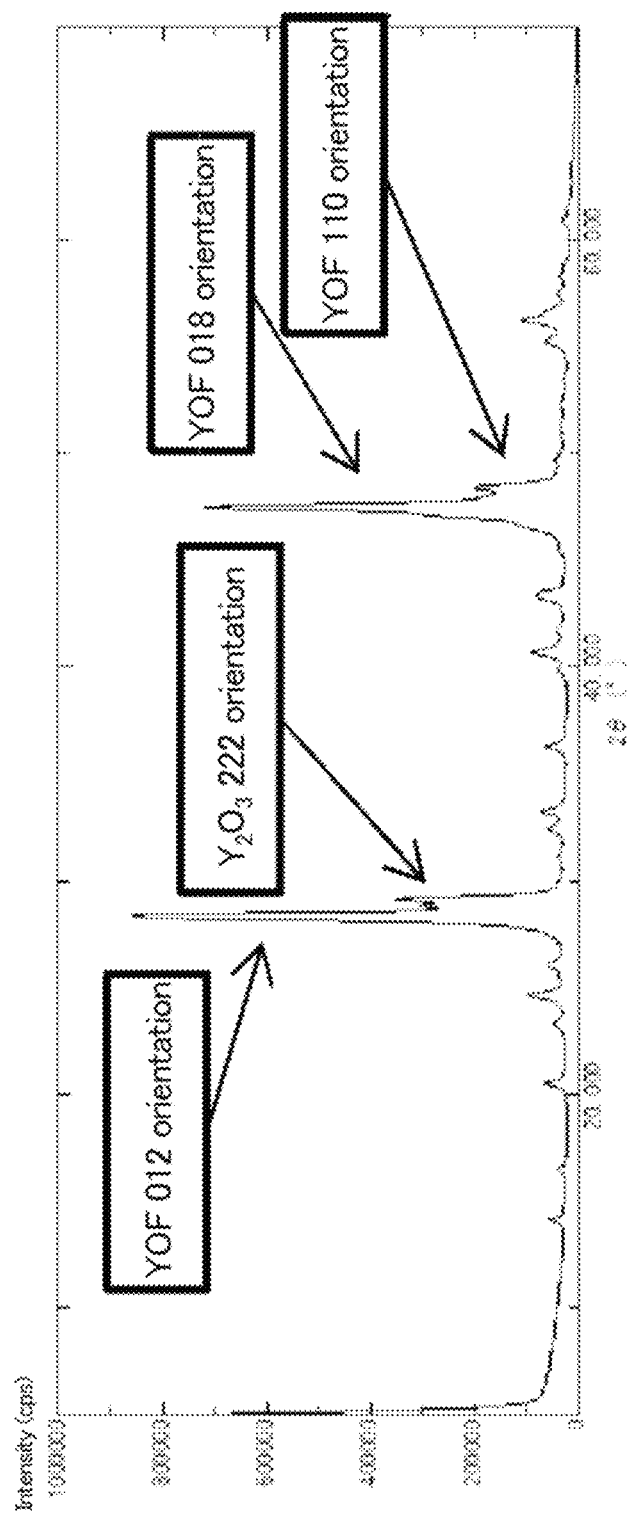
FIG. 6 is an X-ray diffractogram of the coating obtained in Example 1.

The coating was analyzed by XRD under the following conditions. In every Example, the main peak observed in the 2θ angle range of from 0° to 70° was assigned to YOF, the height of the main peak assigned to YF$_3$ observed in that 2θ angle range was 20% or less of that of the main peak assigned to YOF in the same 2θ angle range, and the height of the main peak assigned to Y$_2$O$_3$ in that 2θ angle range was 40% or less of that of the main peak assigned to YOF in the same 2θ angle range. The X-ray diffractogram of the coating of Example 1 is shown in FIG. 6.

Conditions of XRD:

Equipment: Ultima IV (from Rigaku Corp.)

Source: CuKα rays

Tube voltage: 40 kV

Tube current: 40 mA

Scanning speed: 2°/min

Step size: 0.02°

Measurement range: 2θ=0° to 70°

10. Oxygen Content of Coating

The oxygen content of the coating was measured by the inert gas fusion method using an oxygen/nitrogen analyzer EMGA-920 from Horiba, Ltd.

The oxygen contents of the coatings of Examples 1, 2, and 3 were found to be 13%, 10%, and 7%, respectively. The oxygen content of the coating of Comparative Example 1 was 18%.

Resistance to Corrosion by Halogen-Based Plasma:

The coatings obtained in Examples and Comparative Example were evaluated for resistance to corrosion by halogen plasma by the method below. The results obtained are shown in Table 3.

Method for Evaluating Resistance to Particle Shedding:

The coating formed on a 100 mm square aluminum ceramic substrate was subjected to plasma etching. A 3-in. diameter silicon wafer was placed in the chamber beforehand. The number of particles having a particle size of about 0.1 μm or greater out of those shed from the coating due to the etching action and attached to the surface of the silicon wafer was counted using a magnifier. The plasma etching was performed using fluorine-based plasma under the following conditions:

Atmosphere gas: CHF$_3$:Ar:O$_2$=80:160:100 mL/min

RF power: 1300 W

Pressure: 4 Pa

Temperature: 60° C.

Etching time: 50 hours.

The plasma etching test was conducted in the same manner, except for replacing the atmosphere gas CHF$_3$ with HCl to create chlorine-based plasma.

TABLE 3

| | Number of Particles | |
|---|---|---|
| | F-based Plasma | Cl-based Plasma |
| Example 1 | 16 | 23 |
| Comparative Example 1 | 203 | 289 |

The above results prove that the coating material of the invention provides an yttrium oxyfluoride coating having a specifically high hardness and excellent resistance to corrosion by plasma.

INDUSTRIAL APPLICABILITY

The coating material of the invention forms a coating by PVD that is hard and excellent in resistance to corrosion by plasma, such as fluorine-based or chlorine-based plasma. The coating of the invention exhibits excellent resistance to corrosion by plasma, such as fluorine-based or chlorine-based plasma.

The invention claimed is:

1. A coating material comprising an oxyfluoride of yttrium and having a Fisher diameter of 1.0 to 10 μm and a ratio TD/AD of a tap density TD to an apparent density AD, of 1.6 to 3.5 wherein the tap density TD and the apparent density AD are measured in accordance with Japanese Industrial Standards, JIS Z 2512 and JIS K 5101, respectively.

2. The coating material according to claim 1, wherein the coating material has a pore volume of pores with a diameter of 100 μm or smaller of 1.0 cm$^3$/g or less as measured by mercury intrusion porosimetry.

3. The coating material according to claim 2, wherein the coating material has an angle of repose of 40° or greater.

4. The coating material according to claim 3, wherein the tap density TD is in a range of 1.0 g/cm$^3$ to 2.0 g/cm$^3$.

5. The coating material according to claim 3, wherein the tap density TD is in a range of 1.2 g/cm$^3$ to 1.8 g/cm$^3$.

6. The coating material according to claim 2, wherein the coating material has the ratio TD/AD of 1.7 to 3.2.

7. The coating material according to claim 2, wherein the coating material has the ratio TD/AD of 1.8 to 3.0.

8. The coating material according to claim 2, wherein the tap density TD is in a range of 1.0 g/cm$^3$ to 2.0 g/cm$^3$.

9. The coating material according to claim 2, wherein the tap density TD is in a range of 1.2 g/cm$^3$ to 1.8 g/cm$^3$.

10. The coating material according to claim 1, wherein the coating material has an angle of repose of 40° or greater.

11. The coating material according to claim 10, wherein the coating material has the ratio TD/AD of 1.7 to 3.2.

12. The coating material according to claim 10, wherein the coating material has the ratio TD/AD of 1.8 to 3.0.

13. The coating material according to claim 10, wherein the tap density TD is in a range of 1.0 g/cm$^3$ to 2.0 g/cm$^3$.

14. The coating material according to claim 10, wherein the tap density TD is in a range of 1.2 g/cm$^3$ to 1.8 g/cm$^3$.

15. The coating material according to claim 1, wherein the coating material has the ratio TD/AD of 1.7 to 3.2.

16. The coating material according to claim 1, wherein the coating material has the ratio TD/AD of 1.8 to 3.0.

17. The coating material according to claim 1, wherein the tap density TD is in a range of 1.0 g/cm$^3$ to 2.0 g/cm$^3$.

18. The coating material according to claim 1, wherein the tap density TD is in a range of 1.2 g/cm$^3$ to 1.8 g/cm$^3$.

19. A powder for a coating material, the powder comprising an oxyfluoride of yttrium and having a Fisher diameter of 1.0 to 10 μm and a ratio TD/AD of a tap density TD to an apparent density AD, of 1.6 to 3.5 wherein the tap density TD and the apparent density AD are measured in accordance with Japanese Industrial Standards, JIS Z 2512 and JIS K 5101, respectively.

* * * * *